United States Patent [19]
Baldwin

[11] Patent Number: 5,506,529
[45] Date of Patent: Apr. 9, 1996

[54] ADJUSTABLE FREQUENCY SYNTHESIZER

[75] Inventor: George H. Baldwin, Burlington, Canada

[73] Assignee: Douglas R. Baldwin, Hamilton, Canada

[21] Appl. No.: 404,836

[22] Filed: Jan. 19, 1995

Related U.S. Application Data

[63] Continuation-in-part of Ser. No. 185,083, Jan. 24, 1994, abandoned.

[51] Int. Cl.⁶ .................................................. H03L 7/18
[52] U.S. Cl. ........................ 327/113; 327/105; 327/107; 327/156; 331/1 A
[58] Field of Search ........................... 331/25, 34, 1 A; 327/105, 107, 156, 159, 160, 141, 172, 113, 117

[56] References Cited

U.S. PATENT DOCUMENTS 4,380,743  4/1983  Underhill et al. ............... 327/105

Primary Examiner—Timothy P. Callahan
Assistant Examiner—Dinh T. Le
Attorney, Agent, or Firm—Rogers & Scott

[57] ABSTRACT

A phase-locked loop frequency synthesizer with adjustable frequency has blanking circuits to remove a predetermined number of pulses per second from a signal applied to an associated frequency divider. Each blanking circuit comprises a latch circuit operated by a signal of predetermined latch frequency to disable the associated frequency divider a number of times per second equal to the predetermined latch frequency. A counter circuit coupled to the latch circuit and adjustably set by an associated selector controls the latch circuit and enables the frequency divider said number of times per second after a predetermined number of pulses of a signal supplied to the frequency divider according to the setting of the associated selector. The number of pulses per second removed by the blanking circuit is thus controlled by the setting of the associated selector multiplied by the number of times per second the associated latch circuit is operated.

6 Claims, 4 Drawing Sheets

ADJUSTABLE FREQUENCY SYNTHESIZER

This application is a continuation-in-part of application Ser. No. 08/185,083 filed Jan. 24, 1994 and now abandoned.

FIELD OF THE INVENTION

This invention relates to frequency synthesizers of the phase-locked-loop (PLL) type.

BACKGROUND OF INVENTION

It is known to provide such frequency synthesizers with a pulse blanking circuit which assists in determining the output frequency of the synthesizer. Pulse blanking is sometimes referred to as pulse swallowing, pulse losing or pulse absorbing. Usually, such frequency synthesizers have been developed for the production of frequencies used for communication purposes.

OBJECT OF INVENTION

It is an object of the present invention to provide an adjustable frequency synthesizer of the PLL kind utilizing the pulse blanking principle and which can provide a range of selectable calibrated frequencies such as those used in industrial plants, for example from 100,000 to 999,900 Hz.

STATEMENT OF INVENTION

The present invention provides a PLL frequency synthesizer with adjustable frequency comprising a signal source of predetermined reference frequency of 10, 100 or 1,000 Hz, a comparator having a first input receiving said reference frequency signal, a second input receiving a signal of divided frequency, and an output producing an output signal dependent on the difference between or equality of the reference frequency signal and the divided frequency signal, the comparator operating to adjust the frequency of the increased frequency signal produced by the oscillator in such a manner as to equalize the frequencies of the divided frequency signal and the reference frequency signal, and a voltage controlled oscillator controlled by the comparator output signal to produce an output signal of increased frequency. A first frequency divider divides the frequency of a signal derived from the increased frequency output signal to produce a first divided frequency signal at an output, a first blanking circuit operates to remove a predetermined number of pulses per second from the increased frequency output signal to produce the derived signal whose frequency is divided by the first frequency divider, and a first adjustable selector adjustably selects the number of pulses per second to be removed by the first blanking circuit. A second frequency divider divides the frequency of a signal derived from the first divided frequency signal to produce a second divided frequency signal, a second blanking circuit operates to remove a predetermined number of pulses per second from the second divided frequency signal to produce the derived signal whose frequency is divided by the second frequency divider, and a second adjustable selector adjustably selects the number of pulses to be removed by the second blanking circuit, the signal of divided frequency received by the second input of the comparator being the second divided frequency signal or a derivative thereof.

Each blanking circuit may comprise a latch circuit operated by a signal of predetermined latch frequency to disable the associated first or second frequency divider a number of times per second equal to the second predetermined latch frequency, and a counter circuit adjustably set by the associated first or second selector to control the latch circuit and enable the frequency divider said number of times per second after a predetermined number of pulses of the increased frequency output signal or the first divided frequency signal according to the setting of the associated first or second selector, whereby the number of pulses per second removed by the first or second blanking circuit is controlled by the setting of the first or second selector respectively multiplied by said number of times per second the associated latched circuit is operated. The predetermined latch frequency may equal the predetermined reference frequency. The predetermined frequency, the frequency of the divided frequency signal received by the comparator and the predetermined latch frequency may be 100 Hz, with each selector being adjustable to select any integral number in the range of from 0 to 9.

The first divider may divide the frequency of the signal derived from the increased frequency output signal by ten, and the second divider may divide the frequency of the signal derived from the first derived frequency signal also by ten, whereby the output frequency of the synthesizer can be varied in steps of 100 Hz by adjustment of the first selector and in steps of 1,000 Hz by adjustment of the second selector to produce output frequencies in the range of from 100,000 to 109,900 Hz.

The frequency synthesizer may also include a third frequency divider which divides the frequency of the second derived frequency signal to produce the signal of divided frequency received by the comparator, the third frequency divider being a programmable divider controlled by third and fourth adjustable selectors, the third selector being adjustable to select any integral number in the range of from 0 to 9 and said fourth selector being adjustable to select any integral number in the range of from 1 to 9 representing tens to enable settings of from 10 to 99 to be obtained and thereby enable the synthesizer output frequency to be adjusted in steps of 10,000 Hz from to 100,000 to 990,000 Hz independently of the smaller steps controlled by the first and second selectors.

The frequency synthesizer may also include a third latch circuit operated by a signal with a frequency of 10 Hz and a third counter circuit adjustably set by a fifth adjustable selector, the fifth selector being adjustable to select any integral number in the range of from 0 to 9, the third latch circuit and the third counter circuit being connected in parallel with the first latch circuit and the first counter circuit whereby the third latch circuit operates to disable the first frequency divider ten times per second and the third counter circuit operates to enable the first frequency divider ten times per second after a predetermined number of pulses as set by the fifth selector to thereby enable the synthesizer frequency output to be adjusted in steps of 10 Hz.

DESCRIPTION OF THE DRAWINGS

Embodiments of the invention will now be described, by way of example, with reference to the accompanying drawings, of which.

DESCRIPTION OF PRIOR ART

Figure 1:
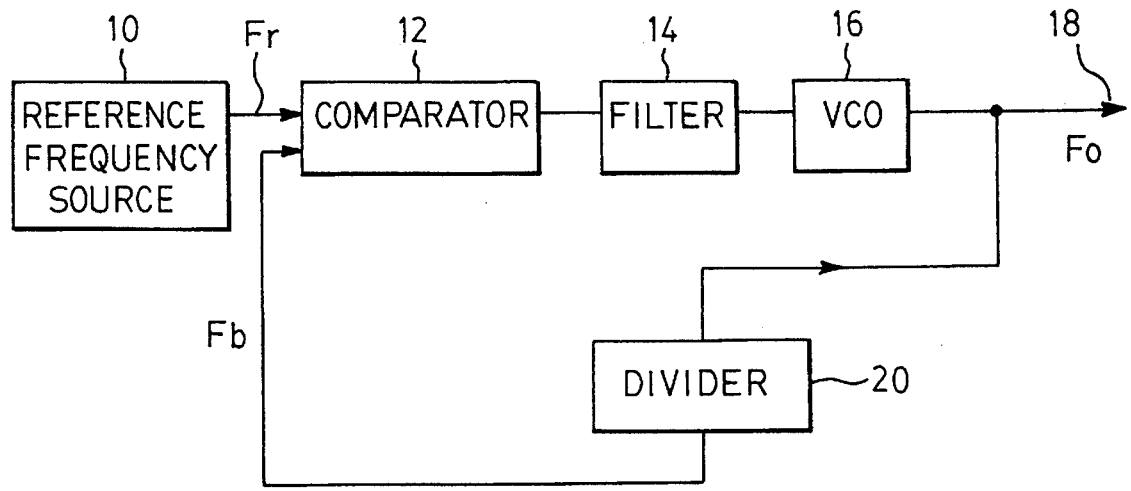
FIG. 1 is a block diagram of a PLL frequency synthesizer of fixed frequency in accordance with the prior art.

Referring to the drawings, FIG. 1 shows a PLL frequency synthesizer of fixed frequency in accordance with the prior art. A reference frequency source (RFS) 10, which may comprise for example a divided-down crystal, provides a signal with a stable reference frequency Fr which is fed to one input of a comparator (comp) 12, the other input of which receives a signal with frequency Fb. The output of comparator 12 is passed through a voltage smoothing filter 14 to a voltage controlled oscillator (VCO) 16. The output of the oscillator 16 with frequency Fo is passed to a synthesizer output 18 and to a divider 20 which divides the frequency Fo by a factor X to produce the signal with frequency Fb which is fed to the other comparator input as mentioned above.

Comparator 12 causes oscillator 16 to oscillate at frequency Fo at which frequencies Fr and Fb are equal.

Thus $Fr=Fb=Fo+X$ ie. $Fo=Fr.X$

Figure 2:
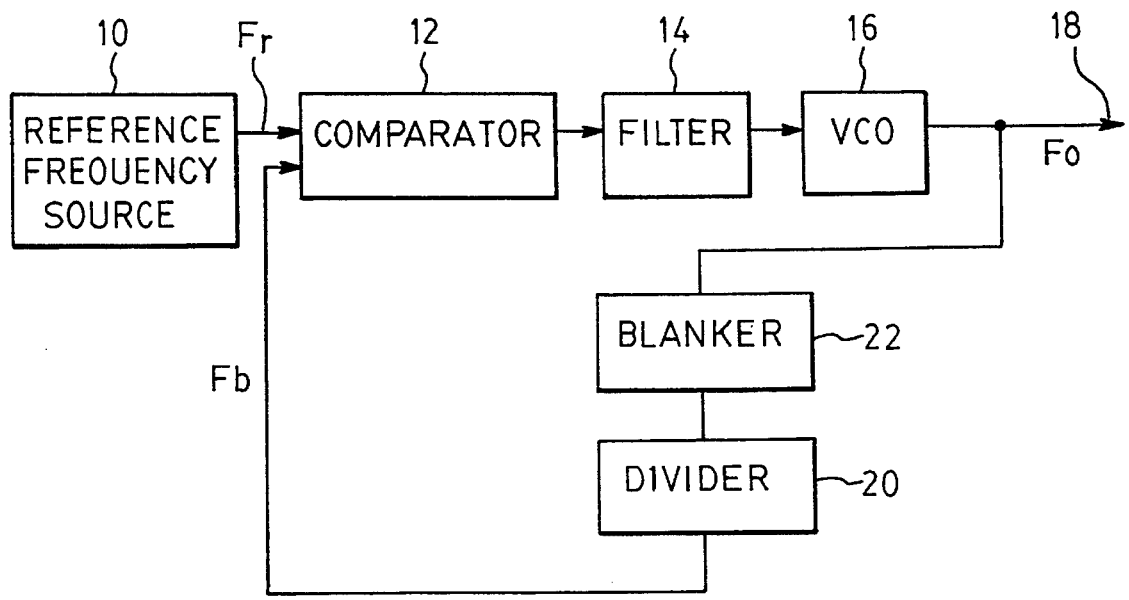
FIG. 2 shows the frequency synthesizer of FIG. 1 with a pulse blanking circuit added, also in accordance with the prior art.

FIG. 2 shows a similar circuit also in accordance with the prior art, with the addition of a pulse blanking circuit or blanker 22 between the Fo output 18 and the frequency divider 20. If blanker 22 blanks out, for example, one pulse per second, the frequency of the signal sent to divider 20 is Fo-1.

Therefore $Fo -1=Fr.X$ ie. $Fo=Fr.X+1$

Thus, the synthesizer output frequency is increased by the blanking action.

DESCRIPTION OF PREFERRED EMBODIMENTS

Figure 3:
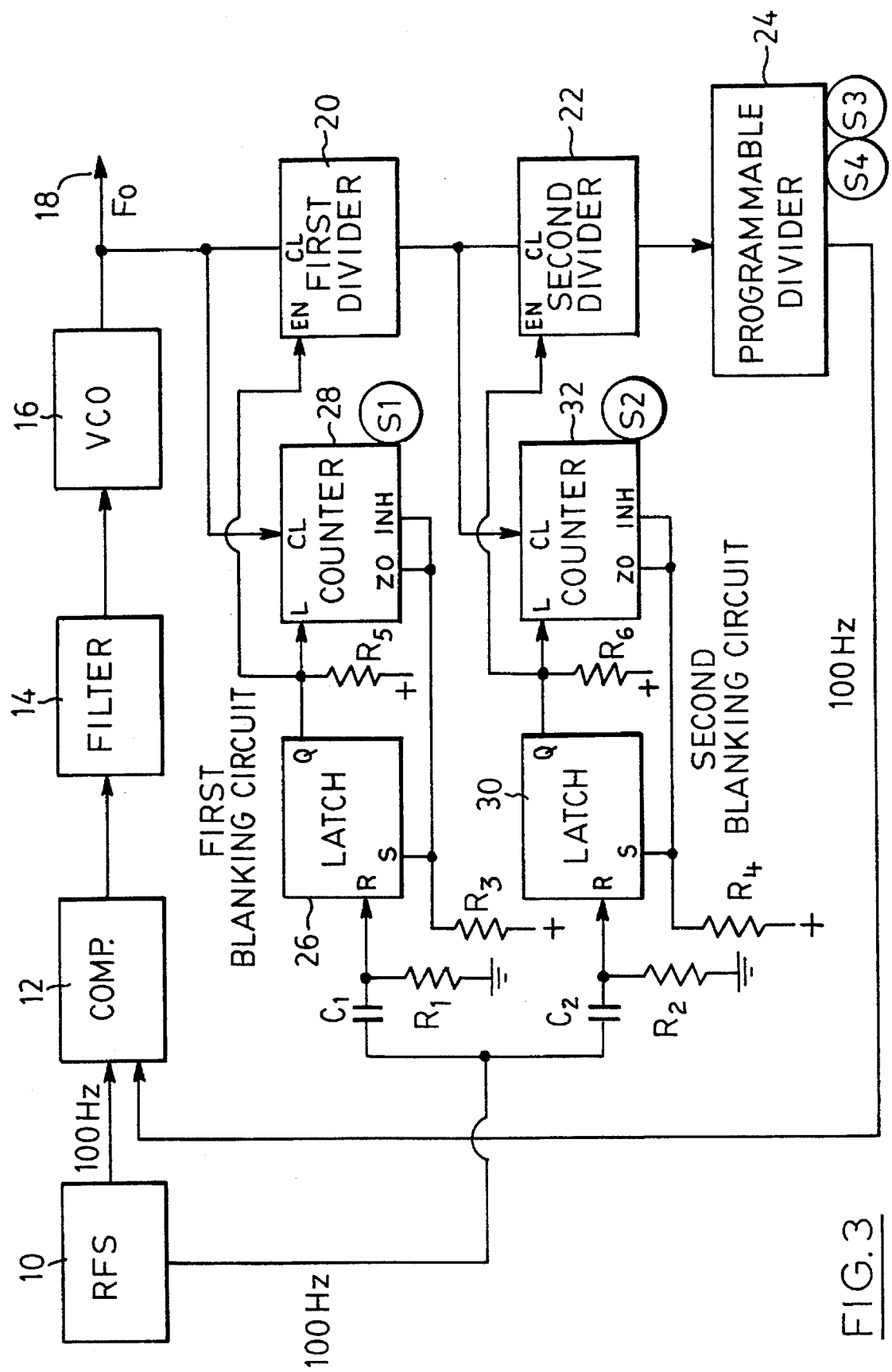
FIG. 3 is a block circuit diagram of a frequency synthesizer with adjustable frequency in accordance with one embodiment of the invention.

FIG. 3 shows a frequency synthesizer with adjustable frequency in accordance with the invention. In this embodiment, the predetermined frequency of the reference frequency source 10 is 100 Hz. The frequency synthesizer has a first frequency divider 20 receiving a signal of frequency Fo from the voltage controlled oscillator 16, a second frequency divider 22 receiving a signal of divided frequency from the first divider 20, and a programmable divider 24 receiving a signal of divided frequency from the second divider 22. The first and second dividers 20, 22 each divide the frequency of the signal received thereby by ten. The divided signal produced by programmable divider 24 has a frequency of 100 Hz and is fed to the comparator 12.

A first blanking circuit associated with the first frequency divider 20 comprises a first latch circuit 26 and a first adjustable counter circuit 28, the counter circuit 28 being adjustable by a first manually operable selector S1. A second blanking circuit associated with the second frequency divider 22 comprises a second latch circuit 30 and a second adjustable counter circuit 32, the counter circuit 32 being adjustable by a second manually selector S2. The first and second selectors S1, S2 can each be set at any integral value in the range of from 0 to 9 and are known per se in the art.

The first latch circuit 26 has a terminal R which receives a 100 Hz trigger signal from reference frequency source 10 via a resistor-capacitor circuit $C_1$, $R_1$ which sharpens the trigger pulses. Resistor $R_1$ is connected to ground. Each trigger pulse triggers the latch circuit 26 to reverse a voltage at terminal Q from positive to negative. Terminal Q of latch circuit 26 is connected to terminal L of counter circuit 28 and to enable terminal EN of first frequency divider 20. Terminal Q of latch circuit 26 is also connected through resistor $R_5$ to a positive voltage. Terminal S of latch circuit 26 and terminals ZO and INH of counter circuit 28 are connected through resistor $R_3$ to a positive voltage. The signal of frequency Fo from voltage controlled oscillator 16 received by the first frequency divider 20 is also received by terminal CL of counter circuit 28.

Similarly, the second latch circuit 30 has a terminal R which also receives the 100 Hz trigger signal from reference frequency source 10 via a resistor-capacitor circuit $C_2R_2$ which sharpens the trigger pulses. Resistor $R_2$ is connected to ground. Each trigger pulse triggers the latch circuit 30 to reverse the voltage at terminal Q from positive to negative. Terminal Q of latch circuit 30 is connected to terminal L of counter circuit 32 and to enable terminal EN of the second frequency divider 22. Terminal Q of latch circuit 30 is also connected through resistor $R_6$ to a positive voltage. Terminal S of latch circuit 30 and terminal Z0 and INH of counter circuit 32 are connected through resistor $R_4$ to a positive voltage. The signal of divided frequency from the first divider 20 received by the second divider 22 is also received by terminal CL of counter circuit 32.

The latch circuits 26, 30 may be provided by an IC 4013, the counter circuits 28, 32 may each be an IC 4522, and the first and second frequency dividers 20, 22 may be provided by an IC 4518. The programmable divider 24 may be an IC 4522. A person skilled in the art will be familiar with such components. The programmable divider 24 is conventional and has two manually operable selectors S4 and S3 settable in the range from 10 to 99, i.e. selector S4 can be set at any integral number in the range of from 1 to 9 representing tens and selector S3 can be set at any integral number in the range of from 0 to 9.

If selectors S1 and S2 are each set to zero and selectors S3 and S4 are set at their minimum, i.e. 10, the voltage controlled oscillator 16 will produce an output signal with a frequency Fo of 100,000 Hz to balance comparator 12, since a frequency of 100,000 Hz will be sent by oscillator 16 to the first frequency divider 20, which will then send a signal of 10,000 Hz to the second frequency divider 22. The second divider 22 then sends a signal of 1,000 Hz to programmable divider 26, which sends a signal of 100 Hz to comparator 12, this frequency being equal to the reference frequency of 100 Hz from reference frequency source 10.

As previously mentioned, a sharp trigger pulse is sent to terminal R of the first latch circuit 26 one hundred times per second. Each such pulse causes terminal Q to become negative, with a negative signal consequently being applied to terminal EN of first divider 20 and terminal L of counter circuit 28. The negative signal at terminal EN of first divider 20 disables the divider. The negative signal at terminal L of counter circuit 28 causes the counter circuit to start counting the pulses of the Fo signal applied thereto at terminal CL. Thus, divider 20 is prevented from effecting divider action on such pulses. The counter continues to count the Fo pulses until a number equal to the setting of selector S1 is reached. The Z0 terminal of counter circuit 28 then becomes negative. The negative signal is applied to terminal S of latch circuit 26 to cause the voltage at terminal Q thereof to reverse, i.e. become positive. The positive signal is applied to terminal L of counter circuit 28 to cause the counter circuit to stop counting and is also applied to terminal EN of first divider 20 to enable divider 20 so that it resumes dividing. Because the frequency of the signal applied to terminal R of latch circuit 26 is 100 Hz, the sequence repeats itself one hundred times per second.

If for example selector S1 is set to 4, four pulses are removed from the Fo signal applied to first divider 20 one hundred times per second i.e. a total of 400 pulses per second. Thus, the first frequency divider 20 now divides the frequency of a signal derived from the Fo signal. In order to maintain equality of frequency of the two signals applied to the comparator 12, the Fo signal produced by the voltage controlled oscillator 16 becomes 100,000 Hz plus 400 Hz, i.e. 100,400 Hz. Thus, S1 controls the fourth digit of the output frequency.

When selector S1 is set at 0, the counter circuit 28 functions to maintain a positive signal at terminal Z0 such that a positive signal is present at terminal Q of latch circuit 26 and divider 20 is not disabled. Operation of switch S1 can therefore vary the output of the voltage controlled oscillator 16 at output 18 in steps of 100 Hz from 100,000 to 100,900 Hz.

The second blanking circuit functions in a similar manner as the first blanking circuit except that operation of selector S2 controls the output frequency at output 18 in steps of 1,000 Hz from 101,000 to 109,000 Hz. It will be noted that counter circuit 32 does not receive the signal of divided frequency from first divider 20 until the first blanking circuit has finished blanking i.e. removing pulses. The first and second blanking circuits thus function sequentially and do not interfere with one another.

If for example selector S2 is set to 4, four pulses are removed from the signal of divided frequency applied to second divider 22 one hundred times per second, i.e. a total of four hundred pulses per second. Thus, the second frequency divider 22 now divides the frequency of a signal derived from the signal of divided frequency from the first divider 20. In order to maintain equality of frequency of the two signals applied to the comparator 12, the Fo signal produced by the voltage controlled oscillator 16 becomes 100,000 Hz plus 4,000 Hz i.e. 104,000 Hs (assuming selector S1 is set at 0). Thus, selector S2 controls the third digit of the output frequency. The selectors S4, S3 of programmable divider 24 can vary the dividing action thereof from 10 to 99. In other words, the minimum dividing setting for programmable divider 24 is 10. Assuming that selectors S1, S2 are set to zero, the frequency of the output Fo from oscillator 16 when the setting of the programmable divider 24 is 10 will be 100,000 Hz. If selector S4 is then set to its minimum value of one (representing 10), with selector S3 being set to four, the dividing factor will be 14 and the output frequency Fo will become 140,000 Hz. Thus, operation of selector S3 varies the output frequency from 100,000 to 190,000 Hz in steps of 10,000 Hz. If selector S4 is set at 4, with selector S3 being set at zero, the dividing factor will be 40. The frequency Fo produced by voltage controlled oscillator 16 will then be 400,000 Hz. Operation of selector S4 thus varies the output frequency of from 100,000 to 900,000 Hz in steps of 100,000 Hz.

Therefore, by operation of selectors S4, S3, S2, S1, the output frequency Fo can be varied from 100,000 to 999,900 Hz in steps of 100 Hz. It will be noted that selectors S4, S3 control the first and second digits respectively of the output frequency.

Figure 4:
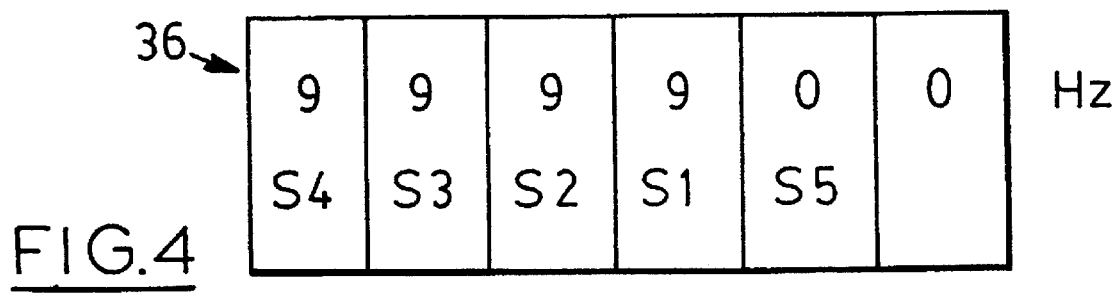
FIG. 4 is a diagrammatic view of the visual display of a frequency selector switch which can be used with the frequency synthesizer of FIG. 3.

FIG. 4 is a diagrammatic view of a manually operable frequency selector switch 36 with four thumb wheel or push-type selector members which from left to right represent the selectors S4, S3, S2, S1 followed by "00". The selector 36 thus displays the complete frequency range of the synthesizer shown in FIG. 3. Selector S5 shown in FIG. 4 will be described later with reference to FIG. 5.

The frequency synthesizer shown in FIG. 3 can produce a range of square waves with a range of from 100,000 to 999,900 Hz. There are 9,000 selectable frequency values in this range, all with the same accuracy as reference source 10 (Fr=100 Hz). The separation between each pair of selected values is 100 Hz so the resolution is 50 Hz.

The number of selected values and the range itself may be extended by conventional circuitry (not shown). For example, adding a four stage decade divider at output 18 would enable a total of 45,000 values to be obtained, the range being from 10 to 999,900 Hz. Such a synthesizer would have four figure resolution for all selected values. The resolution in the 10–99 Hz range would be 50+10,000 ie. 0.005 Hz.

With the addition of a decade divider, it is also convenient to add five light emitting diodes (LEDs) to the display shown in FIG. 4 to provide a decimal point to the synthesized frequency value.

Figure 5:
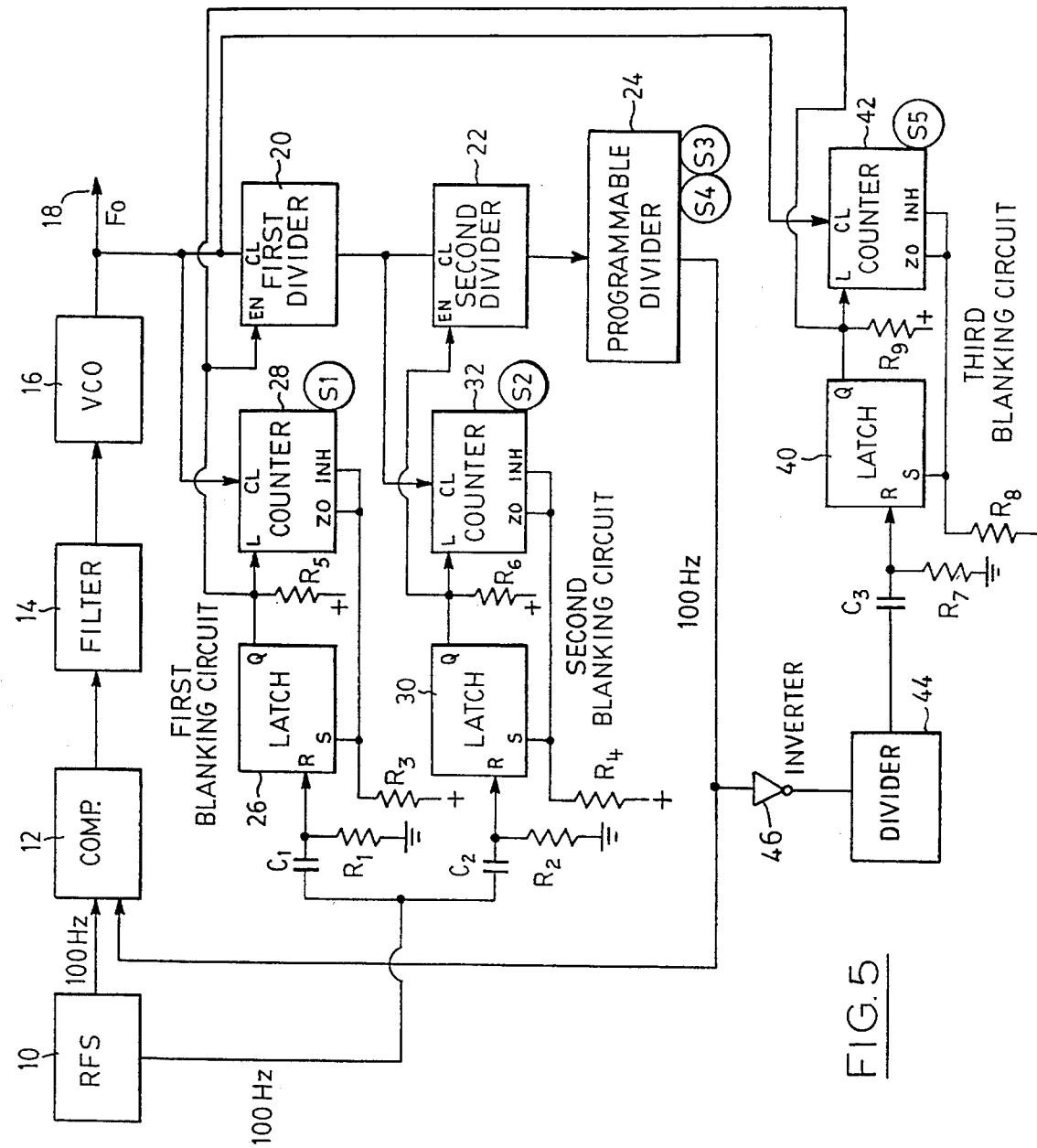
FIG. 5 is a block circuit diagram of a modification which can be used with the frequency synthesizer of FIG. 3.

FIG. 5 is a block circuit diagram of modification which can be used with the frequency synthesizer of FIG. 3 and comprises a third blanking circuit which is associated with the first frequency divider 20 in parallel with the first blanking circuit. It will be understood that the first and second blanking circuits, the second frequency divider 22 and the programmable divider 24 will also be present in the frequency synthesizer to be described with reference to FIG. 5 but have been omitted for clarity.

The third blanking circuit comprises a third latch circuit 40 and a third adjustable counter circuit 42 which are similar to the latch circuits and counter circuits previously described. The counter circuit 42 is adjustable by a fifth manually adjustable selector S5 which may be set at any integral value in the range of from 0 to 9 and is known per se in the art. The third latch circuit 40 has a terminal R which receives a 10 Hz signal derived from the reference frequency source 10, which has a frequency of 100 Hz. The phase of the 100 Hz signal from reference frequency source 10 is inverted by inverter 46, and the inverted signal is then divided by ten by a divider 44 to produce a signal of 10 Hz The resulting signal of 10 Hz is then applied to terminal R of latch circuit 40 via a resistor-capacitor circuit $C_3$, $R_7$ which sharpens the trigger pulses. Each trigger pulse triggers the latch circuit 40 to reverse voltage at terminal Q from positive to negative. Terminal Q of latch circuit 40 is connected to terminal L of counter circuit 42 and to enable terminal EN of the first frequency divider 20. Terminal Q of latch circuit 40 is also connected through resistor R9 to a positive voltage. Terminal S of latch circuit 40 and terminal Z0 and INH of counter circuit 42 are connected through resistor R8 to a positive voltage. The signal of frequency of from voltage control oscillator 16 received by the first frequency divider 20 is also received by terminal CL of counter circuit 42. The inverter 40 is provided so that operation of the third blanking circuit does not overlap with operation of the first blanking circuit.

Since a signal frequency of 10 Hz is applied to latch circuit 40, the third blanking circuit only functions 10 times per second compared to the first and second blanking circuits which function 100 times per second. With selectors S4 to S1 at their minimum values, operation of selector S5 will therefore vary the output frequency F0 from 100,000 to 100,090 Hz in steps of 10 Hz. Selector S5 therefore controls the fifth digit and provides a tenfold improvement in adjustability of the output frequency.

Figure 6:
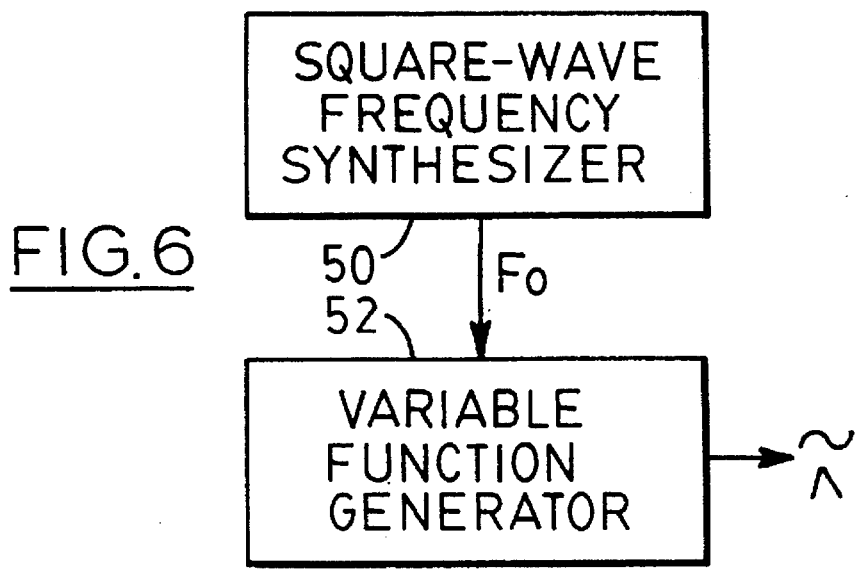
FIG. 6 is a schematic view showing use of the invention to produce pulses of different shape.

FIG. 6 shows a square wave frequency synthesizer 50 of the kind shown in FIG. 3 being used to provide input to a variable function generator 52, which may be an XR 2206 type as known in the art, operable to produce other wave shapes, for example sine, triangle or ramp wave shapes.

It should be noted that, although the frequency synthesizer of FIG. 3 uses two fixed dividers each with a blanking circuit in cascade with a conventional two-stage programmable divider circuit, three fixed dividers each with a blanking circuit and one programmable divider (1–9) circuit could be used. Other combinations are of course possible.

The adjustable selectors S4, S3, S2 and S1 may not necessarily be manually operable. For example, the selectors may be timer controlled switches which are set to produce a desired series of different frequency bursts. Also, when manually operable, the selectors may be for example the thumb wheel, push-button or keyboard type.

A person skilled in the art will appreciate from the foregoing description that the present invention provides a frequency synthesizer that is user friendly, i.e. a desired frequency is readily selectable, is relatively inexpensive and requires no supporting frequency counter. Known frequency counters may take several ten second periods to display the test frequency with maximum accuracy.

Other embodiments of the invention will also be readily apparent to a person skilled in the art, the scope of the invention being defined in the appended claims.

I claim:

1. A phase-locked loop frequency synthesizer with adjustable frequency comprising:

a signal source of predetermined reference frequency of 10, 100 or 1,000 Hz, a comparator having a first input receiving said predetermined reference frequency signal, a second input receiving a signal of divided frequency, and an output producing an output signal dependent on the difference between or equality of said reference frequency signal and said divided frequency signal, a voltage controlled oscillator coupled to said comparator to produce an output signal of increased frequency as synthesizer output, said comparator operating to adjust the frequency of the increased frequency signal produced by the voltage controlled oscillator in such a manner as to equalize the frequencies of said divided frequency signal and said predetermined reference frequency signal, a first frequency divider coupled to said synthesizer output which divides the frequency of said increased frequency output signal to produce a first divided frequency signal at an output, a first blanking circuit coupled between the signal source and output of said voltage controlled oscillator to remove a predetermined number of pulses per second from the increased frequency output signal before division by said first frequency divider, a first adjustable selector coupled to said first blanking circuit for adjustably selecting the number of pulses per second to be removed by the first blanking circuit, a second frequency divider coupled to said first frequency divider, which divides the frequency of said first divided frequency signal to produce a second divided frequency signal, a second blanking circuit coupled between the signal source and output of said first frequency divider to remove a predetermined number of pulses per second from the first divided frequency signal before division by said second frequency divider, and a second adjustable selector coupled to said second blanking circuit for adjustably selecting the number of pulses to be removed by the second blanking circuit, said signal of divided frequency received by the second input of the comparator being said second divided frequency signal or a derivative thereof, each blanking circuit comprising a latch circuit operated by a signal of predetermined latch frequency to disable the associated first or second frequency divider a number of times per second equal to said predetermined latch frequency, and a counter circuit coupled to said latch circuit and adjustably set by the associated first or second selector to control the latch circuit and enable the frequency divider said number of times per second after a predetermined number of pulses of the increased frequency output signal or the first divided frequency signal according to the setting of the associated first or second selector, whereby the number of pulses per second removed by the first or second blanking circuit is controlled by the setting of the first or second selector respectively multiplied by said number of times per second the associated latch circuit is operated.

2. A frequency synthesizer according to claim 1 wherein the predetermined latch frequency equals the predetermined reference frequency.

3. A frequency synthesizer according to claim 1 wherein said predetermined reference frequency, the frequency of said divided frequency signal received by the comparator and said predetermined latch frequency is 100 Hz, and each selector is adjustable to select any integral number in the range of from 0 to 9.

4. A frequency synthesizer according to claim 3 wherein the first divider divides the frequency of said increased frequency output signal minus the predetermined number of pulses per second removed by said first blanking circuit by ten, and said second divider divides the frequency of the first divided frequency signal minus the predetermined number of pulses per second removed by said second blanking circuit by ten, whereby the output frequency of the synthesizer can be varied in steps of 100 Hz by adjustment of the first selector and in steps of 1,000 Hz by adjustment of the second selector to produce output frequencies in the range of from 100,000 to 109,900 Hz.

5. A frequency synthesizer according to claim 4 further comprising:

a third frequency divider coupled to said second frequency divider which divides the frequency of said second divided frequency signal to produce the signal of divided frequency received by the comparator, said third frequency divider being a programmable divider controlled by third and fourth adjustable selectors coupled thereto, said third selector being adjustable to select any integral number in the range of from 0 to 9 and said fourth selector being adjustable to select any integral number in the range of from 1 to 9 representing tens to enable settings of 10 to 99 to be obtained and thereby enable the synthesizer output frequency to be adjusted in steps of 10,000 Hz from 100,000 to 990,000 Hz independently of the smaller steps controlled by the first and second selectors.

6. A frequency synthesizer according to claim 3 further comprising:

a third blanking circuit coupled between the signal source and output of said voltage controlled oscillator, said third blanking circuit comprising a third latch circuit operated by a signal with a frequency of 10 Hz and a third counter circuit coupled to said third latch circuit and adjustably set by a fifth adjustable selector coupled to said third counter circuit, said fifth selector being adjustable to select any integral number in the range of from 0 to 9, said third latch circuit and said third counter circuit being connected in parallel with said first latch circuit and said first counter circuit whereby said third latch circuit operates to disable said first frequency divider ten times per second and the third counter circuit operates to enable the first divider ten times per second after a predetermined number of pulses as set by the fifth selector to thereby enable the synthesizer frequency output to be adjusted in steps of 10 Hz.

* * * * *